United States Patent [19]
Cheek et al.

[11] Patent Number: 6,159,812
[45] Date of Patent: Dec. 12, 2000

[54] REDUCED BORON DIFFUSION BY USE OF A PRE-ANNEAL

[75] Inventors: Jon Cheek, Round Rock; William A. Whigham; Derick Wristers, both of Austin, all of Tex.

[73] Assignee: Advanced Micro Devices, Inc., Sunnyvale, Calif.

[21] Appl. No.: 09/020,175

[22] Filed: Feb. 6, 1998

[51] Int. Cl.$^7$ .................................................. H01L 21/336
[52] U.S. Cl. .................... 438/303; 438/299; 438/510; 438/517; 438/680; 438/481; 438/486; 438/514; 438/530; 438/540
[58] Field of Search ............................................. 438/303

[56] References Cited

FOREIGN PATENT DOCUMENTS

| | | |
|---|---|---|
| 0 805 482 A1 | 5/1997 | European Pat. Off. |
| 0 417 955 A1 | 4/1990 | Japan. |
| 03 068134 | 3/1991 | Japan. |
| 3-068134 | 3/1991 | Japan. |
| 0 762 490 A2 | 12/1997 | Japan. |
| 0 762 490 A3 | 12/1997 | Japan. |

OTHER PUBLICATIONS

Sedgwick et al, "Transient boron diffusion in ion–implanted crystalline and amorphous siliocn," J. Appl. Phys. 63(5) pp. 1452–1463, Mar. 1, 1988.

Fair et al, "Modeling Rapid thermal diffusion of arsenic and boron in silicon," J. Electrochem. Soc. 131, 2387, 1994.

Fair "Oxide thickness effect on boron diffusion in thin oxide p+ Si gate technology," IEEE Electron Device Letters vol. 17, No. 5, pp. 242, May 5, 1996.

Fair "Damage removal/dopant diffusion tradeoffs in ultra–shallow implanted p+ –n junctions," IEEE Transactions on Electron Devices vol. 37, No. 10 pp. 2237, 1990.

Fair "Low–thermal–budget process modeling with the PRE-DICT (TM) computer program," IEEE Transactions on Electron Devices vol. 35, No. 3, pp. 285, Mar. 1988.

Ghandhi "VLSI Fabrication Principles Silicon and Gallium Arsendie" pp. 296–299, 1994.

Wolf, Silicon Processing for the VLSI Era, vol. 2, pp. 391, 1990.

Burke et al, "Distributed electron cyclotron resonance in silicon processing: Epitaxy and etching," vol. 8, Iss. 3, pp. 2931–2938, May 1990.

(List continued on next page.)

*Primary Examiner*—John F. Niebling
*Assistant Examiner*—Jonathan Hack

[57] ABSTRACT

A method for slowing the diffusion of boron ions in a CMOS structure includes a preanneal step which can be incorporated as part of a step in which silane is deposited across the surface of the wafer. After the last implant on a CMOS device, silane ($SiH_4$) is deposited over the surface of the wafer using a chemical vapor deposition (CVD) tool. The deposition of silane is done at 400° C. The temperature is raised in the CVD tool to a temperature in the range of 550° C. to 650° C. and held for 30–60 minutes. This temperature does not affect the thin film of silicon which is formed from the silane, yet provides the necessary thermal cycle to "repair" the crucial first 200 Å to 600 Å of the silicon surface. Normal processing steps, including a rapid thermal anneal for 30 seconds at 1025° C. follow. The RTA is necessary to activate the dopants (arsenic and boron) in the source and drain of the respective devices. The boron dopant species diffuses less during subsequent rapid thermal anneal cycles since the crucial first 200 Å to 600 Å of the silicon surface have been repaired using this preanneal step.

11 Claims, 4 Drawing Sheets

OTHER PUBLICATIONS

XP-002090052 M. Craig et al., Dose Rate and Thermal Budget Optimization for Ultrashallow Junctions Formed by Low-Energy (2-5 ke V) ion Implantation, J. Vac. Sci. Technol., vol. B14, No. 1, Feb. 1996, pp. 255-259.

XP-00209053 R. Kwor and D.L. Kwong, Rapid Thermal Annealing Characteristics of As+-and $BF_2$-Implanted Si, Applied Physics Letters, vol. 45, No. 1, Jul. 1984, pp. 77-79.

XP-002090054 S. Guimares et al., Enhanced Diffusion Phenomena During Rapid Thermal Annealing of Preamorphized Boron-Implanted Silicion, Istituot Lamel del C.N.R., Bologna, Italy, vol. 95, No. 2, pp. 589-598.

XP-002090052 M. Craig et al., *Dose Rate and Thermal Budget Optimization for Ultrashallow Junctions Formed by Low-Energy (2-5 keV) ion Implantatation*, J. Vac. Sci. Technol., vol. B14, No. 1, Feb. 1996, pp. 255-259.

XP-002090053 R. Kwor and D. l. kwong, *Rapid Thermal Annealing Characteristics of AS+-and $BF_2$ +-Implanted Si*, Applied Physics Letters, vol. 45, No. 1, Jul. 1984, pp. 77-79.

XP-001080044 S. Guimares et al., *Enhanced Diffusion Pheomena During Rapid Thermal Annealing of Preamorphized Boron-Implaned Silicon,* Istituto LAMEL del C.N.R., Bologna, Italy, vol. 95, No. 2, pp. 589-598.

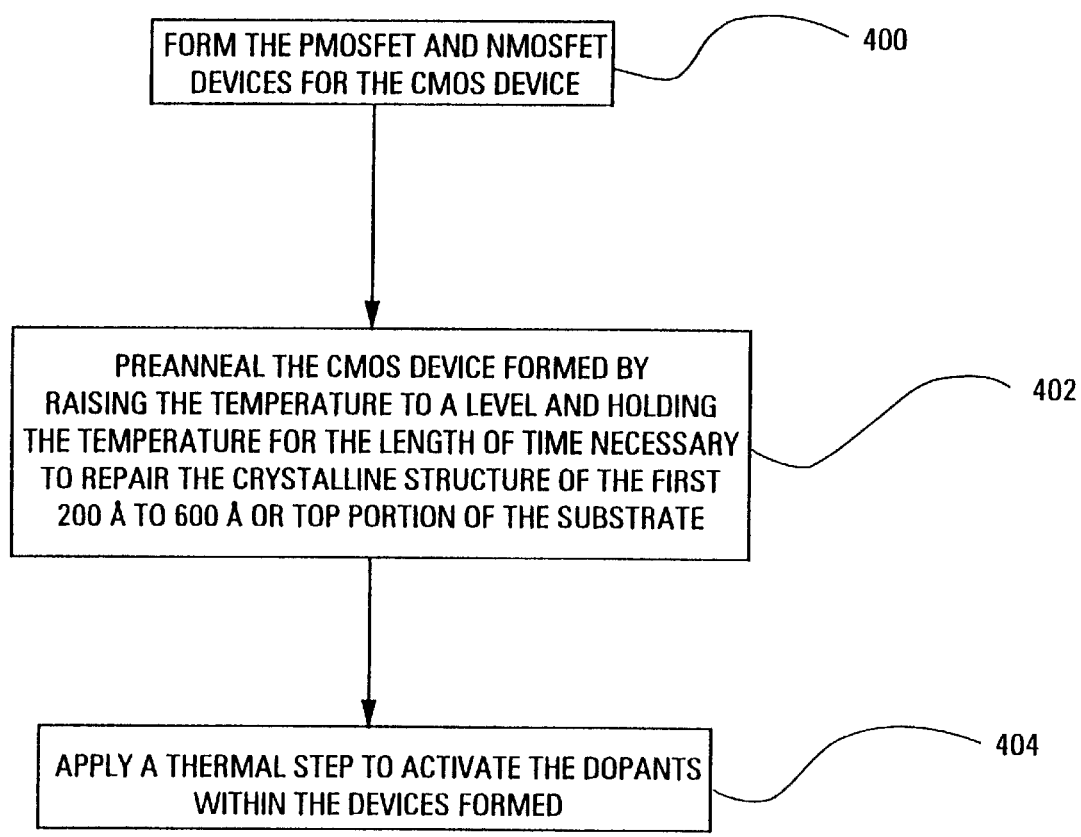

REDUCED BORON DIFFUSION BY USE OF A PRE-ANNEAL

FIELD OF THE INVENTION

The present invention relates generally to semiconductor integrated circuits. More particularly, it pertains to the method and structure for forming N-channel and P-channel MOS transistors on the same chip.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a insulating layer such as a dielectric layer. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain. Currently, arsenic is the dopant most commonly used in forming an NMOSFET and boron is the dopant most commonly used in forming a PMOSFET Complimentary MOS (CMOS) is a MOS circuit formed with both N-channel and P-channel transistors. CMOS has become the standard circuit for many applications. It is the CMOS circuit that has made possible digital watches and hand-held calculators. It allows circuits on one chip that would require several chips using N-channel and P-channel only circuits. CMOS circuits also use lower amounts of power than comparable circuits.

CMOS structures are typically formed by first fabricating an N-channel MOS transistor in a deep P-type well formed in the wafer surface. After N-channel transistor formation, a P-channel transistor is fabricated. The transistor structures are polysilicon gate or other advanced structures. CMOS processing uses the most advanced techniques since smaller, more densely packed, and higher-quality components all increase the advantages inherent in the CMOS design.

There are problems with the manufacture of CMOS structures. These problems alter design of a CMOS device. One of the most difficult items to consider in the design of CMOS transistors is the application of heat cycles and their effect on already present dopant species. Dopants react differently and uniquely to thermal cycles and therefore great care must be taken when designing transistors. As mentioned above, boron is used as the P-type dopant for p-channel gates and source/drain regions. Boron has been used to form the PMOSFETS designed using CMOS as well as chips which use only PMOSFETS. The dopants are introduced into a substrate using ion implantation. Silicon is the substrate that is currently used in making most all of MOS type transistors. Silicon substrates are also used in CMOS transistor designs.

Ion implantation of dopant species is used throughout the process in the fabrication of CMOS transistors. Implants are used to selectively dope regions to form conductive pathways in the silicon wafer. Ion Implantation is a good method for introducing dopants because during manufacture, the dose and energy at which the species are introduced can be controlled very accurately. One drawback of ion implantation is the creation of "defects" in the silicon lattice which have adverse effects on transistor fabrication at later steps. One "defect" is the creation of amorphous silicon which must be annealed to return it to its crystalline state. This anneal is an added thermal cycle which must be taken into account when designing both n-channel and p-channel transistors. Not only does the anneal cycle take away from the thermal budget, it also provides the heat for already present species and the just implanted species to diffuse. The diffusion is enhanced by the fact the first few hundred angstroms of the silicon surface is amorphous, leading to an accelerated and uncontrolled rate of dopant diffusion.

Boron can be activated with a much lower heat treatment than arsenic which is often used for n-channel gate and source/drain doping. Not only does boron diffuse readily through amorphous silicon, it segregates into and through the oxide layers used as insulators between the gate and the channel in a MOS type transistor. Boron does not move as readily in repaired or annealed silicon. Thermal cycles are an absolutely essential part of transistor fabrication and design because they activate implanted dopant species and they recrystallize the damaged silicon surface. Currently, boron will diffuse more readily if subjected to the same thermal cycles as arsenic.

As shown above, there is a need for a process which can be used to manufacture PMOSFETS in such a way to prevent or substantially hinder the movement through silicon or into the gate oxides or trench isolation areas to allow for more flexibility in the design of CMOS devices. There is also a need to control the diffusion of boron to control electrical parametrics on sub-micron devices. Without some method to control the diffusion of boron, the performance of the CMOS device may be compromised. Furthermore, there is a need to introduce this control without adding separate heat treat process steps so as to maintain the thermal budget associated with the CMOS design.

SUMMARY OF THE INVENTION

One way to partially control the effect of implant damage and its affect on dopant during the subsequent anneal is to repair the silicon surface with a lower temperature anneal which does not affect the dopant distribution and then follow with the normal high temperature rapid thermal anneal. Integration of this concept into a conventional CMOS process flow, throughput and process tool availability have to be considered. Just adding or inserting a low temperature furnace anneal would add precious cycle time and complexity to the flow. This pre-anneal could be added during the deposition of a thin film which is normally added just after the implant and before the high temperature anneal. At the deposition operation, the thin film is deposited as normal but then the tool's temperature is raised to 550° C. to 650° C. for a duration of 30 minutes to a hour. This temperature would not affect the thin film and would provide the necessary thermal cycle to "repair" the crucial first 200 Å to 600 Å of the silicon surface. Normal processing would resume with the dopant species diffusing less during subsequent anneal cycles.

A method for slowing the diffusion of boron ions in a CMOS structure includes a preanneal step which can be incorporated as part of a step in which silane is deposited across the surface of the wafer. After the last implant on a CMOS device, silane (SiH$_4$) is deposited over the surface of the wafer using a chemical vapor deposition (CVD) tool. The deposition of silane is done at 400° C. The temperature is raised in the CVD tool to a temperature in the range of 550° C. to 650° C. and held for 30–60 minutes. This is a preanneal step. The temperature does not affect the thin film of silane and provides the necessary thermal cycle to "repair" the crucial first 200 Å to 600 Å of the silicon surface. Normal processing steps, including a rapid thermal anneal (RTA) for 30 seconds at 1025° C. follow. The RTA is necessary to activate the dopants (boron) in the source and drain of the respective devices. The boron dopant species diffuses less during this rapid thermal anneal cycle since the crucial first 200 Å to 600 Å of the silicon surface have been repaired using this preanneal step.

Advantageously, the wafer does not have to be moved to another tool to accomplish the preanneal step. The chemical vapor deposition (CVD) chamber used to deposit the thin film of silane is merely heated to a higher temperature and maintained for an additional time of approximately 30–60 minutes. Advantageously, the diffusion of the boron atoms is slowed since boron does not diffuse as well in the silicon repaired by this preannealling step.

The method is not limited to use in a CMOS device. The use of a preannealing step could also be used in formation of PMOSFET. It should be noted that many PMOSFETs are formed as part of a CMOS device. In addition, the preannealling step can be done at any time after the devices are formed but before the rapid thermal anneal which is used to activate the various dopants. In other words, the preanneal does not have to be performed in the CVD tool but could be done as a separate process in a separate tool.

An information handling system is also provided which includes the above CMOS device formed using this preannealling step. The information handling system has a central processing unit, a random access memory; and a system bus for coupling the central processing unit to the random access memory. As stated, the system includes the CMOS device formed as described herein.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the embodiments can best be understood when read in conjunction with the following drawings, in which:

FIG. 2 shows a flow chart of several process steps for making a CMOS device having an NMOSFET adjacent a PMOSFET in accordance with an embodiment of the invention.

DETAILED DESCRIPTION OF THE EMBODIMENTS

In the following detailed description of the embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1A:
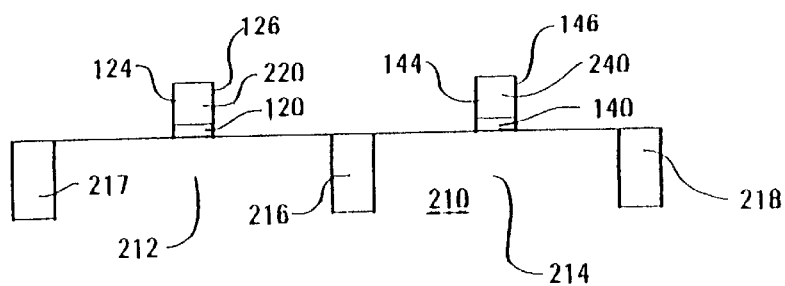
FIGS. 1A–1H show cross-sectional views of successive process steps for making a single PMOSFET in accordance with this invention.
Figure 1B:
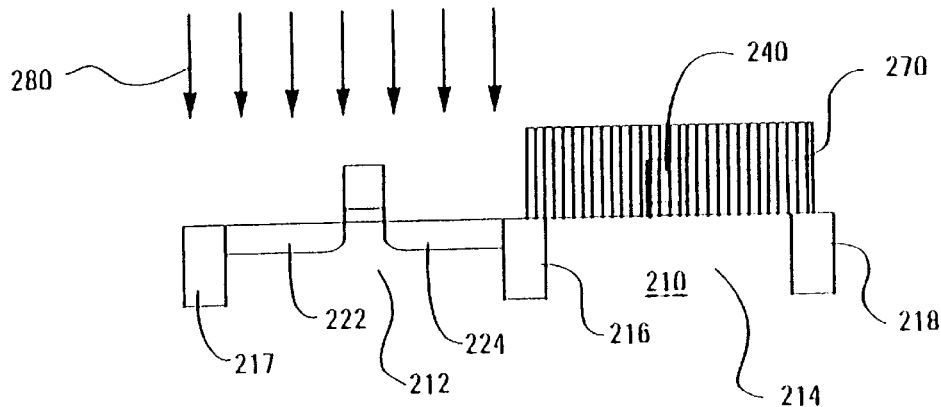

A basic single-well CMOS process can be implemented in either p-well or n-well technology using a plurality of masking levels. There is no standard approach for forming a CMOS device. It should be noted that a CMOS device can be formed in any number of ways. Described below in FIGS. 1A–1G is one example n-well CMOS process. Of course, CMOS devices are comprised of NMOSFETs and PMOSFETs on the same substrate. As shown in FIG. 1A, a substrate 210 has a portion 212 that eventually will be a NMOSFET ("NMOSFET portion 212") and a portion 214 that eventually will be an PMOSFET ("PMOSFET portion 214"). The NMOSFET portion 212 and the PMOSFET portion 214 are separated by an isolation trench 216 to prevent the PMOSFET and NMOSFET that will be formed from forming a lateral NPN type transistor and latching up such that one or both of the MOSFET devices can not switch states. Isolation trenches 217 and 218 are also shown and isolate the MOSFETs formed from adjacent MOSFETs (not shown in FIGS. 1A–1G). The isolation trenches 216, 217, and 218 preserve the integrity of neighboring device operation by preventing electrical shorts between devices. Capacitive coupling between neighboring IGFET structures is likewise minimized.

The NMOSFET devices in the n-well technology are formed in the lightly doped p-substrate 210 ($\leq 1 \times 10^{15}/cm^3$), while the PMOSFET devices are formed in the more heavily doped n-well ($\leq 1 \times 10^{16}/cm^3$). The starting material is either a lightly doped <100> p$^-$ type wafer or a heavily doped <100> p$^+$ wafer with a thin (5–10 $\mu$m thick), lightly doped p-type epitaxial layer at the surface.

The n-well regions are the initial features formed on the starting material. First, a thermal oxide is grown and a CVD nitride film deposited. A first mask is used to pattern windows in these layers, through which phosphorous for the n-well is implanted. Since the implantation process is unable to place the phosphorus ions deeply enough into the silicon, these impurities are driven in to the appropriate depth during subsequent high temperature cycles. An oxide is also grown on the n-well region during the drive-in step. At the conclusion of the drive-in processes the surface concentration in the well is ~$1 \times 10^{16}/cm^3$, and the impurity concentration gradient within the well is also rather small. Note that the redistribution of the well dopants occurs laterally as well as vertically.

Next, a boron threshold-adjust implant is carried out. There is no resist mask for this step, as the thin oxide or oxide/nitride layer covering the silicon wafer surface protects it from contamination. This single implant can provide a correct $V_T$ adjustment for both the NMOSFET and the PMOSFET devices.

The surface is then stripped of its oxide and nitride/oxide layers, and a new pad oxide/nitride layer (needed for LOCOS) is formed. Another mask is then used to pattern its layer to define the active device and field regions. A boron channel-stop implant is performed for the p-substrate 210 field regions. Although no separate mask is used, boron implanted into the well field regions is not of sufficient concentration to significantly alter the n-concentration there.

The field oxide is then grown, after which the nitride/oxide layer is removed from the active device regions. Next, a gate oxide is grown on the substrate 210. The gate oxide covers the substrate 210. Note that a sacrificial pre-gate oxide is frequently grown and stripped prior to the growth of the actual gate oxide. Gate oxide composed of silicon dioxide ($SiO_2$), is formed on the top surface of substrate 210 using oxide tube growth at a temperature of 700° to 1000° C. in an $O_2$ containing ambient. A typical oxidation tube contains several sets of electronically powered heating coils surrounding the tube, which is either quartz, silicon carbide, or silicon. In $O_2$ gas oxidation, the wafers are placed in the tube in a quartz "boat" or "elephant" and the gas flow is directed across the wafer surfaces to the opposite or exhaust end of the tube. A gate oxide 140 having a uniform thickness is formed.

Thereafter, a blanket layer of undoped polysilicon is deposited by low pressure chemical vapor deposition (LPCVD) on top of gate oxide layer. Polysilicon has a thickness of approximately 2000 angstroms. The deposited polysilicon layer is subsequently doped with phosphorus to make it a conductive $n^+$ polysilicon gate material. The resistivity of the polysilicon should be as small as possible, since this layer also serves as an interconnect structure. It is generally preferred that polysilicon is doped during an implantation step following a subsequent etch step.

Photoresist is deposited as a continuous layer on the layer of polysilicon and selectively irradiated using a photolithographic system, such as a step and repeat optical projection system, in which ultraviolet light from a mercury-vapor lamp is projected through a first reticle and a focusing lens to obtain a first image pattern. Thereafter, the photoresist is developed and the irradiated portions of the photoresist are removed to provide openings in photoresist. The openings expose portions of polysilicon to define a gate or a number of gates. An anisotropic etch is applied that removes the exposed portions of polysilicon. Various etchants can be used to anisotropically etch or to selectively remove the polysilicon and oxide layers. Preferably, a first dry or plasma etch is applied that is highly selective of polysilicon. Most of the polysilicon layer is removed, except for the portion beneath the remaining photoresist. A second dry or plasma etch is applied that is highly selective of silicon dioxide (the typical gate material). After the etching step or steps, a gate oxide layer of 60–300 angstroms remains atop the surface of the silicon substrate 210, and the remaining portion of the polysilicon provides a first polysilicon gate 220 and a second polysilicon gate 240. The polysilicon gates 220 and 240 are separated from the substrate 210 by the remaining portions of gate oxide, shown as layers 120 and 140 in FIG. 1A. The gate 220 has a pair of opposing vertical sidewalls 124 and 126. The gate 240 has a pair of opposing vertical sidewalls 144 and 146.

Figure 1C:
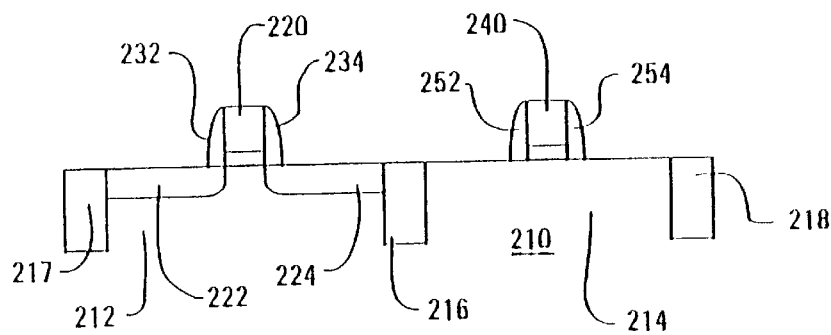

Masks are then used to selectively implant the source/drain regions of the PMOSFET and NMOSFET devices, respectively. The polysilicon associated with each gate 220 and 240 protects the channel region under the gate from being implanted. The PMOSFET portion 214 is initially masked with mask 270. As depicted by arrows 280, the NMOSFET portion 212 is first implanted with arsenic ions to form a first n-type lightly doped region 222 and 224. Arsenic is preferable for the n-type regions so that shallow junctions and minimum lateral diffusion under the gate can be obtained. This implant uses a dose of $1\times10^{15}$ to $4\times10^{15}$ atoms/$cm^2$ and an energy in the range of 1 to 15 kiloelectron-volts. As shown in FIG. 1C, the wafer or substrate 210 is now striped and cleaned then a first spacer 232 and a second spacer 234 are formed on the sidewalls of the gate 220. Similarly, a first spacer 252 and a second spacer 254 are formed on the sidewalls of the gate 240. The spacers 232, 234, 252 and 254 each have thickness of 200 angstroms to 600 angstroms.

Figure 1D:
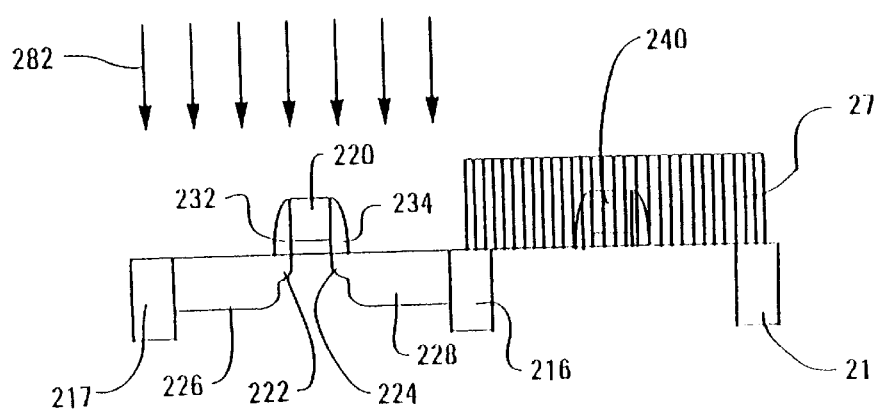

As shown in FIG. 1D, the PMOSFET portion 214 is then masked again with a mask 272. The NMOSFET portion 212 of the wafer or substrate 210 is implanted again, as depicted by arrows 282, with arsenic to form heavily doped regions 226 and 228. Of course, one of the heavily doped drain regions 226 or 228 acts as a source and the other of the regions acts as a drain in the NMOSFET formed. The arsenic is implanted with a dose in the range of $1\times10^{15}$ to $5\times10^{15}$ atoms/$cm^2$ and an energy in the range of 15 to 50 kiloelectron-volts.

Figure 1E:
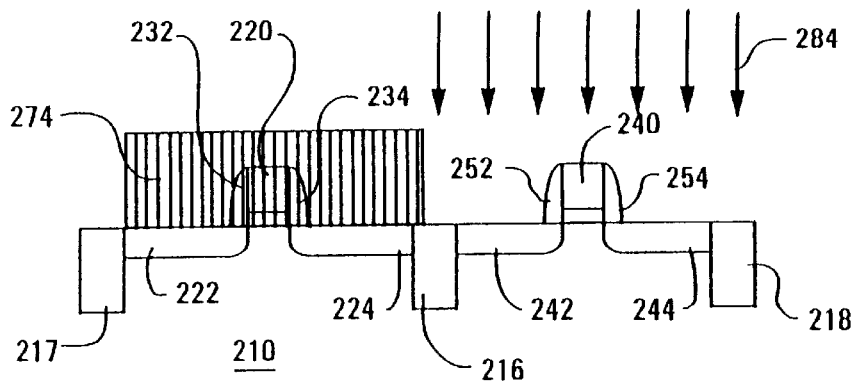

As shown in FIG. 1E, a mask 274 is placed over the NMOSFET area 212. As depicted by arrows 284, boron is then implanted to form the p-channel LDD regions 242 and 244. This implant uses a dose in the range of $5\times10^{14}$ to $3\times10^{15}$ atoms/$cm^2$ and an energy in the range of 5 to 15 kiloelectron-volts.

Figure 1F:
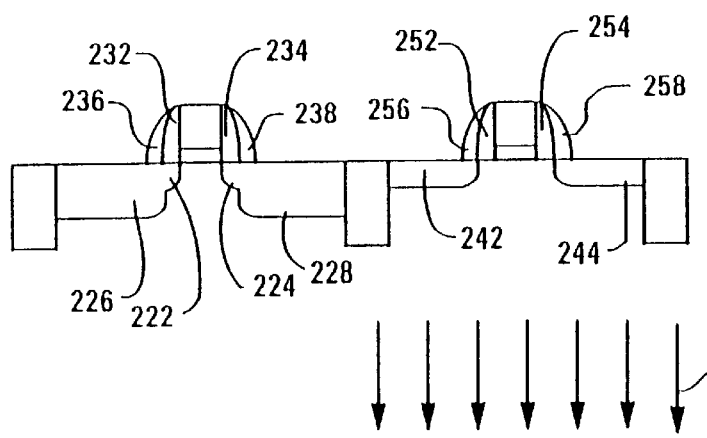

As shown in FIG. 1F, the wafer or substrate is striped and cleaned again, and spacers 236, 238, 256 and 258 are formed adjacent the spacers 232, 234, 252, and 254 respectively. Spacers 236 and 238 are formed on gate 220 and spacers 256 and 258 are added to gate 240. The spacers 236, 238, 256 and 258 formed have a thickness of 400 angstroms to 1200 angstroms.

Figure 1G:
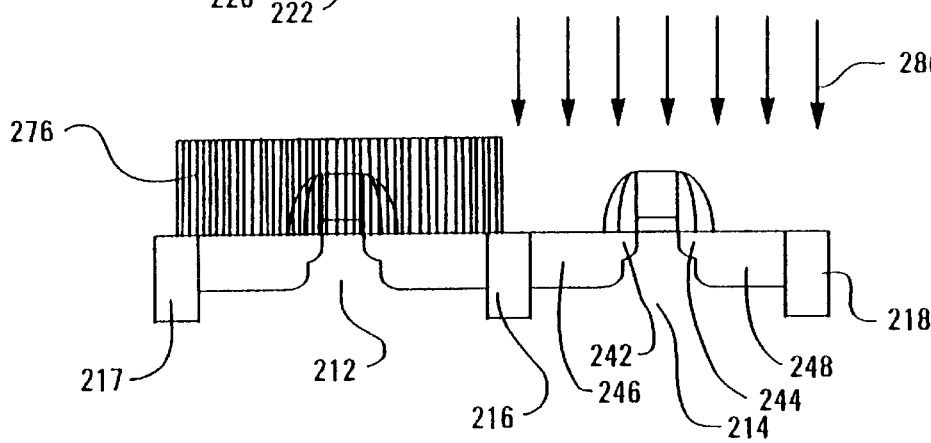

As shown in FIG. 1G, a mask 276 is then placed on the n-channel or on the NMOSFET area 212 of the wafer or substrate 210. As depicted by arrows 286, a boron implant is used with a dose in the range of $2\times10^{15}$ to $5\times10^{15}$ atoms/$cm^2$ and an energy in the range of 15 to 60 kiloelectron-volts. Boron is often implanted as $BF_2$.

Figure 1H:
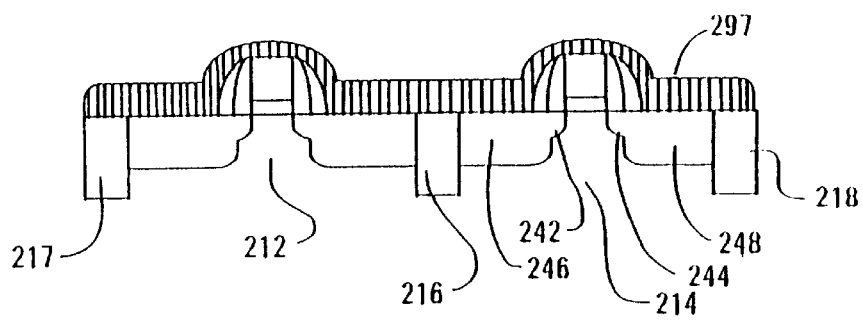

Now turning to FIG. 1H, a protective $SiH_4$ layer is placed over the NMOSFET and PMOSFET devices formed on the substrate. This is also called a resistor protect layer. As shown in FIG. 1H, silane is deposited across the surface of the wafer. After the last implant on a CMOS device, silane ($SiH_4$) is deposited over the surface of the wafer using a chemical vapor deposition (CVD) tool. The deposition of silane is done at 400° C. After the deposition of silane is complete, the temperature is raised in the CVD tool to a temperature in the range of 550° C. to 650° C. and held for 30–60 minutes. Holding a temperature in the range of 550° C. to 650° C. and holding it for 30–60 minutes is referred to as a preannealing step. The temperature associated with the preannealing step does not affect the thin film of silicon which is formed from the silane, yet provides the necessary thermal cycle to "repair" the crucial first 200 Å to 600 Å of the silicon surface of the substrate 210.

Advantageously, the wafer does not have to be moved to another tool to accomplish the preanneal step. The chemical vapor deposition (CVD) chamber used to deposit the thin film of silane is merely heated to a higher temperature and maintained for an additional time of approximately 30–60 minutes. The advantage is that the wafer does not have to be handled once again to place the wafer into a new machine in order to carry out the preannealing step. It should be pointed out that this is just a preferred way of accomplishing the preannealing step. Of course, the preanneal step can be done as a separate step where the wafer is loaded into a separate machine. The preanneal step can also be included as part of another process step in one of the currently used tools in the process. In either of these instances, these variations do not depart from the spirit of this invention.

Normal processing steps, including a rapid thermal anneal for 30 seconds at 1025° C. follow. The RTA is necessary to activate the dopants (arsenic and boron) in the source and drain of the respective devices. The boron dopant species diffuses less during subsequent rapid thermal anneal cycles since the crucial first 200 Å to 600 Å of the silicon surface have been repaired using this preanneal step. Advantageously, the diffusion of the boron atoms is slowed since the boron atoms does not diffuse as well in the silicon repaired by this preannealling step.

FIG. 2 shows a flow chart of several process steps for making a CMOS device having an NMOSFET adjacent a PMOSFET in accordance with an embodiment of the invention. The first step, depicted by reference number 400, is to form the PMOSFET and NMOSFET devices for the CMOS device. The next step, depicted by reference number 402, is to preanneal the CMOS device formed. The temperature is raised, and held for a length of time necessary to repair the crystalline structure of the first 200 Å to 600 Å or top portion of the substrate 210. When the substrate is formed of silicon, this is accomplished by raising the temperature of the substrate with CMOS devices thereon to a temperature in the range of 550° C. to 650° C. and holding it for 30–60 minutes. The step 402 can be done as a separate process step or as part of another process step. The next step is to apply a thermal step to activate the dopants within the device formed. For example, this may be accomplished by a rapid thermal anneal.

Further processing steps in the fabrication of IGFETs typically include forming salicide contacts on the gate, source and drain, forming a thick oxide layer over the active region, forming contact windows in the oxide layer to expose the salicide conforming interconnect metallization in the contact windows, and forming a passivation layer over the interconnect metallization. Salicidation includes the formation of spacers on the gate, depositing a metal layer over the entire resulting surface and reacting the metal to form a salicide on top of the gates 220 and 240 on the top of the source and drain associated with each gate. Unreacted metal is then removed, glass is placed over the surface and a contact opening is formed for connectors. A passivation layer may also then deposited as a top surface. In addition, earlier or subsequent high-temperature process steps can be used to supplement or replace the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above. For instance, the gate insulator and spacers and can be various dielectrics including silicon dioxide, silicon nitride and silicon oxynitride. The thickness of the gate oxides or dielectrics used can be of any suitable thickness. Suitable N-type dopants include arsenic, phosphorus and combinations thereof.

Figure 3:
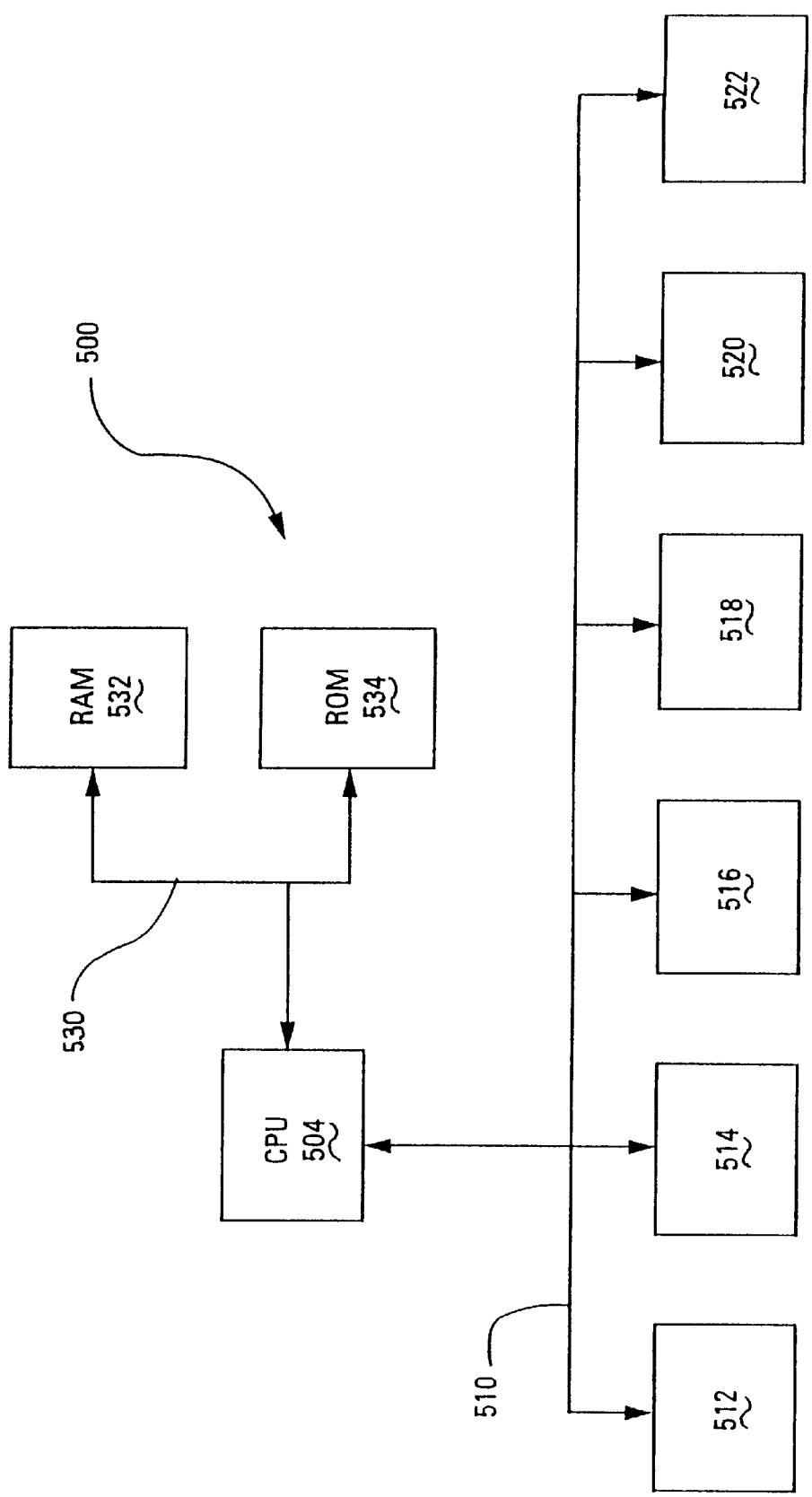
FIG. 3 is a block diagram of an information handling system.

Advantageously, the preanneal process recrystallizes the silicon surface. Using preanneal in the formation of the CMOS results in a device in which the boron of the PMOSFET formed will not migrate or diffuse as easily in a lateral direction or a vertical direction. This eases the design of CMOS devices and the manufacture of CMOS devices since diffusion is lesser of an issue. The invention is also well-suited for use in a device such as an integrated circuit chip, as well as an electronic system including a microprocessor, a memory and a system bus. The electronic system may also be an information handling system 500 as shown in FIG. 3. The information handling system includes a central processing unit 504, a random access memory (RAM) 532, a read only memory (ROM) 534, and a system bus 530 for communicatively coupling the central processing unit 504 and the RAM 532 and the ROM 534. The system 500 also includes an input/output bus 510 and several devices peripheral devices, such as 512, 514, 516, 518, 520, and 522. The device peripherals attach to the input output bus 510. Peripheral devices include hard disk drives, floppy disk drives, monitors, keyboards and other such peripherals. The information handling system 500 includes a CMOS structure such as is shown in FIGS. 1A–1H. The selectivity of the dielectric materials allow for scalable geometric configuration within a reasonable processing budget. The isolation properties of the spacer shell ensure the correct transmission of electrical signals throughout the information handling system.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A method for forming a MOS device, comprising:

forming a MOS structure on a substrate;

chemical-vapor depositing a substance using silane, over the MOS structure at a first selected temperature within a chamber;

raising the temperature to a second selected temperature while the MOS structure is within the chamber;

implanting a dopant and then preannealing the MOS structure by maintaining the MOS structure within the chamber at the second selected temperature for at least 30 minutes and therein repairing at least 200 Angstroms of silicon surface;

rapidly thermal annealing the MOS structure at a third temperature.

2. A method for forming a MOS device according to claim 1, wherein the first selected temperature is about 400° C.

3. A method for forming a MOS device according to claim 1, wherein the second selected temperature is about 550–650° C.

4. A method for forming a MOS device according to claim 1, wherein the third selected temperature is greater than 1000° C.

5. A method for forming a MOS device according to claim 1 said at least 200 Å of silicon surface is less than 600 Å of silicon surface.

6. A method for forming a MOS device according to claim 2, wherein the first selected temperature is about 400° C. and the second selected temperature is about 550–650° C.

7. A method for forming a MOS device according to claim 6, wherein the third selected temperature is greater than 1000° C.

8. A method for forming a MOS device according to claim 7, wherein said at least 200 Å of silicon surface is less than 600 Å of silicon surface.

9. A method for forming a MOS device according to claim 8, further including implanting a dopant before the preannealing.

10. A method for forming a MOS device, comprising:

forming a MOS structure on a substrate;

chemical-vapor depositing a thin film, using silane, over the MOS structure at a first selected temperature within a chamber;

raising the temperature to a second selected temperature while the MOS structure is within the chamber;

implanting a boron dopant;

preannealing the MOS structure by maintaining the MOS structure within the chamber at the second selected temperature for at least 30 minutes and therein repairing at least 200 Angstroms of silicon surface; and rapidly thermal annealing the MOS structure at a third temperature.

11. The method of claim 1, wherein the step of heating the substrate to a selected temperature and holding the temperature for a selected time is completed while the substrate is held in a device associated with another process step.

* * * * *

UNITED STATES PATENT AND TRADEMARK OFFICE
CERTIFICATE OF CORRECTION

PATENT NO. : 6,159,812  
DATED : December 12, 2000  
INVENTOR(S) : Cheek et al.

It is certified that error appears in the above-identified patent and that said Letters Patent is hereby corrected as shown below:

Title page,  
Item [56], OTHER PUBLICATIONS, "XP-00209053" should read -- XP-002090053 --.

Column 6,  
Line 33, "layer is placed" should read -- layer 297 is placed --.

Column 7,  
Line 6, "atoms does not diffuse" should read -- atoms do not diffuse --.

Column 8,  
Line 3, "several devices peripheral devices" should read -- several peripheral devices --.  
Line 30, "chemical-vapor depositing a substance using silane," should read  
-- chemical-vapor depositing a substance, using silane, --.

Signed and Sealed this

Twenty-eighth Day of January, 2003

JAMES E. ROGAN  
*Director of the United States Patent and Trademark Office*